United States Patent [19]
Murakami et al.

[11] Patent Number: 5,506,385
[45] Date of Patent: Apr. 9, 1996

[54] APPARATUS FOR FORMING SOLDER-FILM ON PRINTED-WIRING BOARD

[75] Inventors: Hajime Murakami; Takashi Fukuda, both of Kawasaki, Japan

[73] Assignee: Fujitsu Limited, Kawasaki, Japan

[21] Appl. No.: 314,372

[22] Filed: Sep. 28, 1994

[30] Foreign Application Priority Data

Dec. 14, 1993 [JP] Japan .................... 5-313072

[51] Int. Cl.$^6$ .................... B23K 26/00; B23K 3/06; B23K 35/14
[52] U.S. Cl. .................... 219/121.63; 219/85.12; 219/85.19; 228/180.22; 228/254
[58] Field of Search .................... 219/121.6, 121.63, 219/121.64, 85.12, 85.18, 85.19; 228/180.5, 246, 254

[56] References Cited

U.S. PATENT DOCUMENTS

| | | | |
|---|---|---|---|
| 4,871,110 | 10/1989 | Fukasawa et al. | 228/245 |
| 5,088,639 | 2/1992 | Gondotra et al. | 228/180.1 |
| 5,122,635 | 6/1992 | Knodler et al. | 219/121.63 |
| 5,284,287 | 2/1994 | Wilson et al. | 228/180.2 |

FOREIGN PATENT DOCUMENTS 62-166548  7/1987  Japan .

Primary Examiner—Teresa J. Walberg
Assistant Examiner—J. Pelham
Attorney, Agent, or Firm—Armstrong, Westerman, Hattori, McLeland & Naughton

[57] ABSTRACT

A solder-film forming apparatus for automatically forming a solder-film on a conductive pad of a printed-wiring board. The solder-film forming apparatus includes a mechanism for receiving a solder ball, a suction head provided on a distal end thereof with a holding surface for holding the solder ball and a suction port opening to the holding surface, a suction mechanism for generating a negative pressure in the suction port of the suction head, and a mechanism for moving the suction head. The solder-film forming apparatus further includes a controller having printed-wiring board information in which data including a positional information of the pad on the printed-wiring board is preset and controlling a movement of the suction head by the head moving mechanism and an operation of the suction mechanism in accordance with the printed-wiring board information. A laser beam is irradiated from a laser unit to the solder ball placed on the conductive pad of the printed-wiring board and as a result, the solder ball is fused to form a solder-film. The positional relation between the laser unit and the pad is detected by a camera and corrected.

7 Claims, 9 Drawing Sheets

FIG.11

| KIND | MATERIAL | | DIAMETER | | | HEAD TYPE |
|---|---|---|---|---|---|---|
| | A | B | a | b | c | |
| PAD 1 | ○ | — | ○ | — | — | HEAD 1 |
| PAD 2 | ○ | — | — | ○ | — | HEAD 2 |
| PAD 3 | — | ○ | ○ | — | — | HEAD 3 |
| PAD 4 | — | ○ | — | ○ | — | HEAD 4 |

APPARATUS FOR FORMING SOLDER-FILM ON PRINTED-WIRING BOARD

BACKGROUND OF THE INVENTION

1. Field of the Invention

This invention relates to an apparatus for forming a solder-layer or solder-film on a printed-wiring board.

2. Description of the Related Art

In general, for connecting a wiring material, a lead terminal of an electronic part, or the like to a conductive pad (part of wiring pattern) formed on a surface of a printed-wiring board, the wiring material or the like is bonded to the conductive pad by soldering. For mounting an electronic part, a solder-film is preliminarily formed on the pad. The electronic part is placed on the pad, on which the solder-film is already formed, with the lead terminals, etc. correctly arranged. After the solder-film is fused in a high temperature atmosphere, it is cooled so that the electronic part is mounted on the printed-wiring board. The present invention relates to an apparatus for forming a solder-film on such a pad as just mentioned.

An amount of solder for bonding the electronic part onto the printed-wiring board should be limited to an amount suitable for connecting the lead of the electronic part to the pad in order to obtain a reliable connection, maintain a uniformed product quality, enhance the working efficiency, and so forth. For this purpose, solder balls are heretofore used. The solder balls are spherical balls which are each carefully dimensioned to have a diameter corresponding to the amount of solder which is to be fed onto each pad. Many solder balls having different diameters are prepared depending on the configurations of the pad, the lead of the part, etc.

According to a conventional technique, a solder ball is placed on a specific pad on the printed-wiring board using a pincette or forceps and then contacted with a soldering iron so that the solder ball on the pad is fused and hardened to form a solder-film on the pad. This work is all manually performed. With respect to another conventional technique, a plate-like guide mask having through-holes in that area corresponding to the pads on which the solder-films are to be formed are laid up on the printed-wiring board, and a solder ball is inserted into each and every through-hole by manually handling a pincette. Then, the printed-wiring board is left in a high temperature atmosphere so that the solder balls are fused and thereafter hardened to form a solder-film on each pad. The time reqired for leaving the printed-wiring board in the high temperature atmosphere is about an hour.

According to the above-mentioned conventional techniques, since the work for pinching the solder balls with the pincette and placing them on respective pads, and the work for contacting a soldering iron to the solder balls for fusing are all manually performed, the working efficiency is not good. Especially, since there is recently a requirement for designing a printed-wiring board with a very small dimension and arranging electronic parts in high density, the pads are being gradually made smaller and smaller and therefore the diameter of each solder ball is being gradually made smaller and smaller. This makes the above kind of manual work even more difficult. According to the second-mentioned conventional technique, since the entirety of the printed-wiring board must be put into the high temperature atmosphere even if a single place of a pad is the only spot on which the solder-film is required to be formed, it sometimes gives rise to a problem, among others, in that the printed-wiring board is deteriorated in characteristic by thermal stress.

SUMMARY OF THE INVENTION

It is, therefore, an object of the present invention to provide an apparatus for automatically forming a solder-film on a pad of a printed-wiring board.

Another object of the present invention is to provide an apparatus for forming a solder-film, in which solder-films can be selectively formed without deteriorating characteristics of a printed-wiring board.

In accordance with an aspect of the present invention, there is provided an apparatus for forming a solder-film on a printed-wiring board comprising means for receiving a solder ball; a suction head provided on a distal end thereof with a holding surface for holding the solder ball and a suction port opening to the holding surface; suction means for generating a negative pressure in the suction port of the suction head; means for moving the suction head; and control means having printed-wiring board information in which data including a positional information of the pad on the printed-wiring board is preset, for controlling a movement of the suction head by the head moving means and an operation of the suction means in accordance with the printed-wiring board information.

Preferably, the present invention further comprises means for discharging air to the distal end of the suction head when the air discharging means is brought into opposing relation with the suction head. Also, the invention include means for detecting whether or not the solder ball is held on the holding surface of the suction head. This detection means, for example, comprises an infrared ray emitting portion and an infrared ray receiving portion located opposite to the infrared ray emitting portion.

The suction means and the suction head can be communicated with each other through a spiral tube. Also, the invention may further include means for feeding a flux to a pad of the printed-wiring board on which the solder-film is to be formed, before a solder ball is fed thereto. Also, the invention may further comprise means for irradiating a laser beam to a solder ball placed on a pad of the printed-wiring board so that the solder ball is fused in a non-contacted state; and laser moving means for moving the laser irradiating means and controlled by the control means.

In the case where the invention includes the laser irradiating means, it may further include television camera located opposite to the printed-wiring board; and television moving means for moving the television camera so that the television camera is well focused to that pad of the printed-wiring board, on which a solder ball to be fused is placed, and informing the moved amount to the control means, the control means correcting an amount of movement of the laser moving means in accordance with the moved amount of the television camera.

According to the apparatus for forming a solder-film on a printed-wiring board of the present invention, first, in accordance with the printed-wiring board information, the control means specifies the pad on which the solder-film is to be formed, selects a solder ball which is to be fed to the specified pad, and moves a corresponding suction head to the solder ball receiving means which receives the particular solder balls. The suction pad is inserted into the solder balls which are received in the solder ball receiving means, and the suction means is actuated, so that the solder ball is held on the holding surface under the effect of suction force.

Then, the suction head is moved so as to be positioned above that pad of the printed-wiring board onto which the solder ball is to be fed, and the suction means is released (in other words, the suction force from the suction means is canceled). As a result, the solder ball is fed onto the pad and this procedure is repeated as often as required. In this way, since the solder ball is automatically fed onto the pad on the printed-wiring board in accordance with the printed-wiring board information, the working efficiency can be remarkably enhanced compared with the conventional technique in which the solder ball is manually fed. In addition, a proper solder ball can be fed correctly.

In case the invention includes the air discharge means, wasteful solder balls attached to other area than the holding surface of the suction head under the effect of static electricity, etc. can be removed, if any, by discharging air to the distal end of the suction head. And if it is detected, by the detection means, whether or not the solder ball is held on the holding surface of the suction head, a possible inadvertent failure for feeding the solder ball to the pad can be avoided.

Furthermore, by connecting the suction means and the suction head with the spiral tube, undue force is less frequently applied to the suction head. As a result, a constant pressure applied to the pad by the distal end of the suction head can be maintained and therefore, the printed-wiring board is hardly subjected to damage. Also, if the flux is preliminarily applied to the pad on the printed-wiring board by the flux feed means before the solder ball is fed to the pad, the solder ball is held on the pad by the flux and therefore, a possible displacement of the solder ball caused by the effect of vibrations, etc. can be prevented.

On the other hand, after the solder ball is fed, the laser irradiating means is brought to and positioned, by the control means, above that pad which is to be fused, and the solder ball fed onto the pad is subjected to irradiation of the laser beam for a predetermined time period and fused to form a predetermined amount of solder-film on the pad. Since the solder ball is fused spot-wise and in a non-contact state by laser beam, a thermal stress is avoided which is otherwise applied to the entire printed-wiring board even if a small number of solder-films are to be formed, and therefore, the solder-films can be selectively and efficiently formed.

In case the present invention further includes the television camera and the television camera moving means, even in the case where positional irregularity of the printed-wiring board occurs, the positional relation between the printed-wiring board and the laser irradiating means can be corrected always in the best condition and the solder-films can assuredly be formed.

The above and other objects, features and advantages of the presentation and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 11 is a chart showing one example of printed-wiring board information.

DESCRIPTION OF THE PREFERRED EMBODIMENTS

One embodiment of the present invention will be described with reference to the accompanying drawings.

Figure 1:
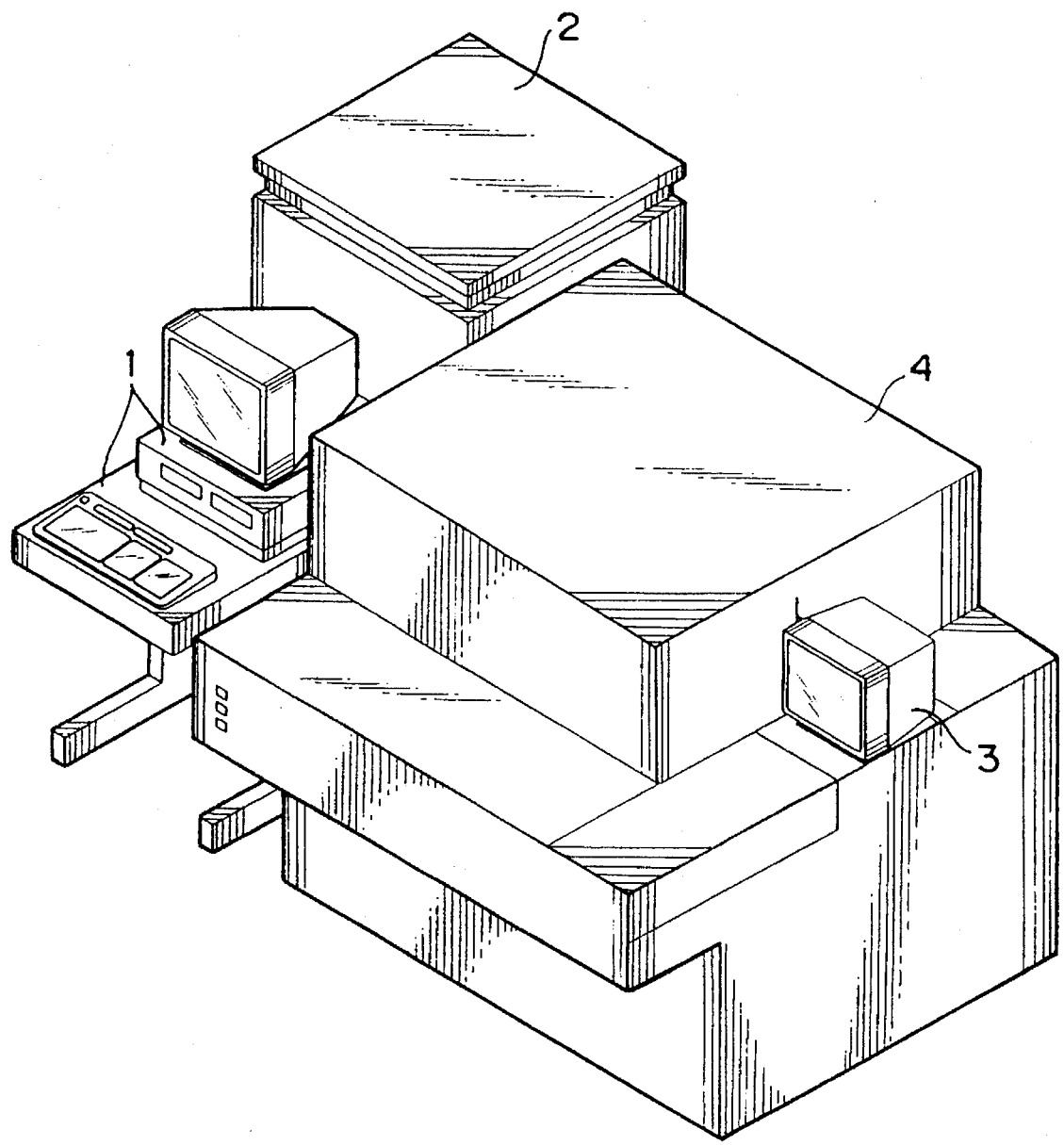
FIG. 1 is a perspective view showing an outer appearance of one embodiment of the present invention.
Figure 2:
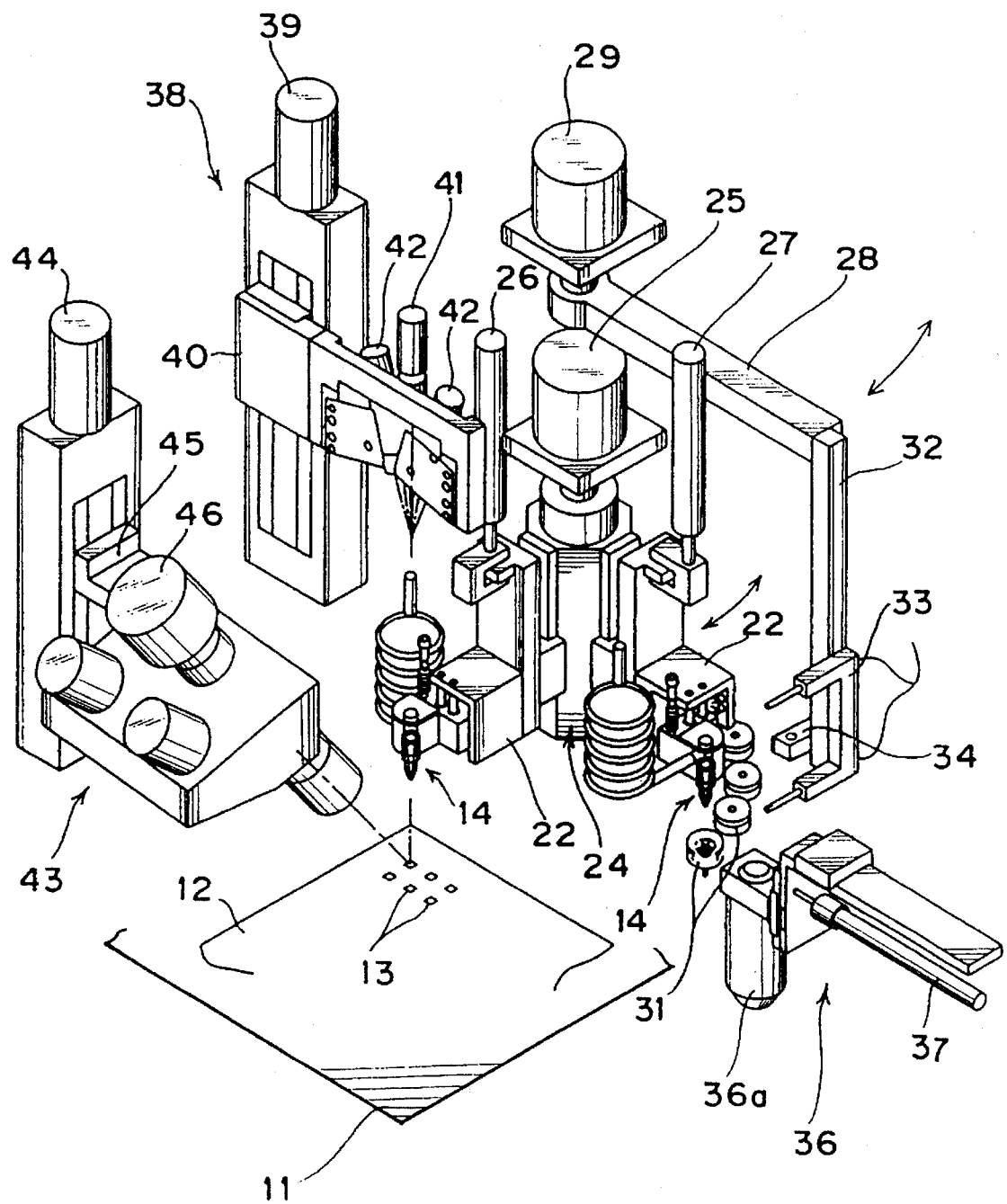
FIG. 2 is a perspective view showing important portions of one embodiment of the present invention.

FIG. 1 is a perspective view showing an outer appearance construction of one embodiment of the present invention and FIG. 2 is a perspective view showing a construction of important portions thereof. In FIG. 1, reference numeral 1 denotes a personal computer. The personal computer 1 is operated to input various data, issue various working instructions and control the entirety of the solder-film forming apparatus. Reference numeral 2 denotes a control unit receiving rack for receiving a control unit which directly controls a motor, a cylinder, etc. in accordance with instructions from the personal computer 1. Reference numeral 3 denotes a monitor television, and 4, a working unit receiving portion, respectively.

Received in the control unit receiving rack 2 are various kinds of control units including an XY table motor controller, a motor controller for moving a camera upwardly and downwardly, a motor controller for moving a laser unit upwardly and downwardly, a laser controller, a motor controller for rotating a head assembly, a motor controller for rotating an arm, a dispenser, various air equipment controllers, and the like.

An internal construction of the working unit receiving portion 4 is shown in FIG. 2. In FIG. 2, reference numeral 11 denotes an X-Y table, and 12, a printed-wiring board having pads (part of wiring patterns) 13 formed on an upper surface thereof. The printed-wiring board 12 is removably secured to the X-Y table 11 by positioning pin means (not shown). The X-Y table 11 is driven by an XY table motor which is controlled by an XY table motor controller to positionably move the printed-wiring board 12 in an X (lateral) direction and a Y (vertical) direction.

Figure 3:
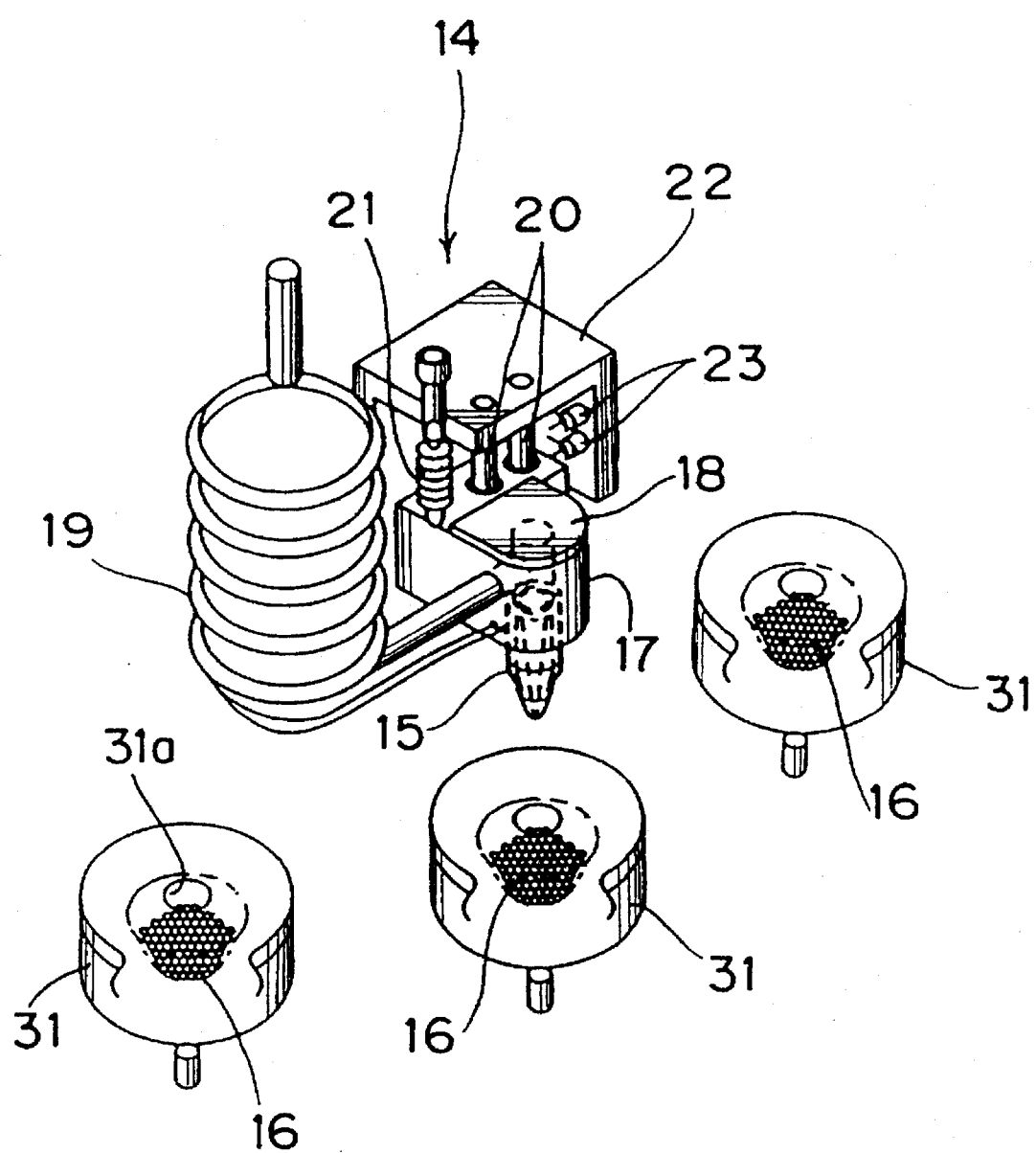
FIG. 3 is a perspective view showing, in detail, a head assembly and ball receiving portions.
Figure 4:
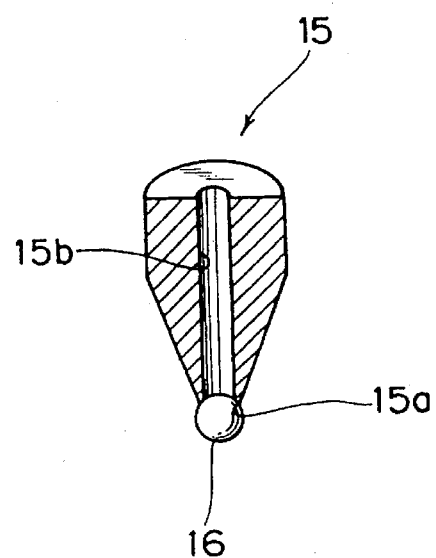
FIG. 4 is a schematic sectional view of a suction head.

Reference numeral 14 denotes a head assembly. The head assembly 14 is constructed as shown in FIG. 3. That is, in FIG. 3, reference numeral 15 denotes a suction head. As shown in an enlarged view of FIG. 4, the suction head 15 is provided on a distal end thereof with a holding surface 15a for holding a solder ball 16, and a through-hole 15b opening to the holding surface 15a. The suction head 15 is fixedly supported by a head support member 17. The head support member 17 has a suction path laterally formed and communicated with the through-hole 15b of the suction head 15. A part of the suction path is allowed to extend along the through-hole 15b and open to an upper portion of the head support member 17. This opening is closed by an acrylic sheet 18 which permits infrared ray to transmit therethrough.

One end of a spiral tube 19 is connected to the suction path of the head support member 17 from outside, and the other end of the spiral tube 19 is connected to suction means not shown. The suction means draws air to cause a negative pressure in the area of the opening of the holding surface 15a of the suction head 15, so that the solder ball 16 is held under the effect of suction force. The head support member 17 is resiliently supported by a slide member 22 through support rods 20 and a spring member 21 so that pressure to the suction head 15 can be released. Reference numeral 23 denotes height detection sensors.

Referring again to FIG. 2, reference numeral 24 denotes a head rotating assembly for vertically slideably supporting the head assemblies 14 and rotating the head assemblies 14. The head rotating assembly 24 vertically slideably supports the slide members 22 which support the head assemblies 14, respectively. The head rotating assembly 24 has a head assembly rotating motor 25 which is controlled by a motor controller for rotating the head assemblies 14. The head assemblies 14 are rotated by this head assembly rotating motor 25. Two head assemblies 14 are shown in FIG. 2. However, in this embodiment, four head assemblies 14 are actually employed. And with respect to the configuration of the holding surface 15a of the suction head 15 of each head assembly 14, the curvature is properly set in accordance with the diameter of each solder ball 16. It is to be understood that the number of the head assemblies 14 is not limited to that of this embodiment.

Reference numeral 26 denotes an air cylinder for moving the head assembly 14 upwardly and downwardly at a location for feeding the solder ball 16. This cylinder 26 is fixedly mounted on a frame not shown. Reference numeral 27 denotes an air cylinder for moving the head assembly 14 upwardly and downwardly at a location for drawing the solder ball 16. The cylinder 27 is integrally attached to a horizontal arm 28 which is rotated by an arm rotating motor 29. As a result, the cylinder 27 is rotated.

Each slide member 22 of the head rotating assembly 24 is provided on an upper end portion thereof with a protuberance, while each of the cylinders 26 and 27 is provided at a distal end portion of a working shaft thereof with a recess for allowing the protuberance to be loosely fitted in the recess. When the slide members 22 and the cylinders 26 and 27 are brought into such a positional relation that the protuberances on the former are fitted in the recesses of the latter, the cylinders 26 and 27 are actuated to cause the head assemblies 14 to move upwardly and downwardly.

A plurality of solder ball receiving portions 31 are arranged on a locus of the suction head 15 to travel along. As shown in FIG. 3, each of the solder ball receiving portions 31 has an opening 31a at an upper side thereof, and a plurality of solder balls 16 are received therein. The solder balls 16 which are received in one solder ball receiving portion 31 are different in diameter and in material from those which are received in other solder ball receiving portions 31. When the cylinder 27 is actuated, the suction head 15 is lowered into the solder ball receiving portion 31 which is located right under the suction head 15. As a result, since the suction means is actuated, the solder ball 16 is held on the holding surface 15a of the suction head 15 under the effect of the suction force.

Figure 5:
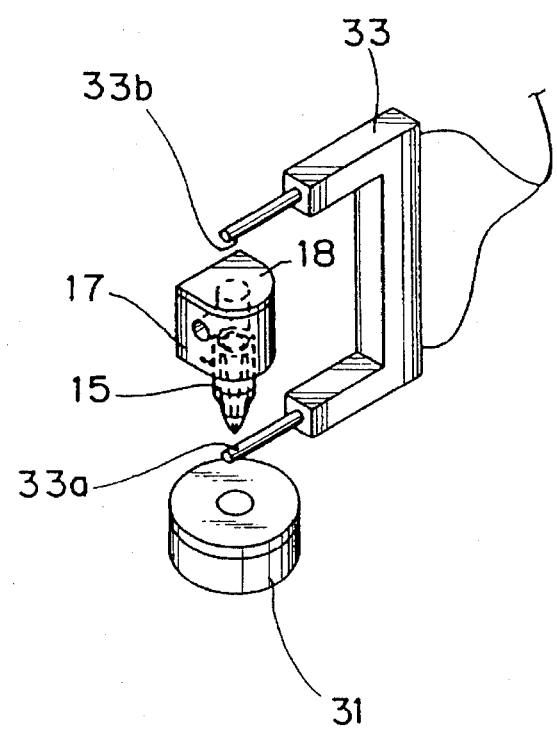
FIG. 5 is a schematic perspective view of an infrared sensor.

In FIG. 2, a vertical arm 32 is integrally connected to a distal end of the horizontal arm 28 on which the cylinder 27 is mounted. An infrared sensor 33 is mounted on a distal end portion of the vertical arm 32. The infrared sensor 33 is also rotated by the arm rotating motor 29. As shown in FIG. 5, the infrared sensor 33 includes a light emitting portion 33a and a light receiving portion 33b. The arm rotating motor 29 and/or the head assembly rotating motor 25 are rotated such that the light emitting portion 33a and the light receiving portion 33b will be on an axis of the through-hole 15b of the suction head 15. In the event the infrared ray from the light emitting portion 33a does not reach the light receiving portion 33b, it is judged that the solder ball 16 is properly held on the holding surface 15a. On the contrary, in the event the infrared ray from the light emitting portion 33a reaches the light receiving portion 33b, it is judged that the solder ball 16 is not properly held on the holding surface 15a. By this, it can be checked whether or not the solder ball 16 is held on the holding surface 15a.

Figure 6:
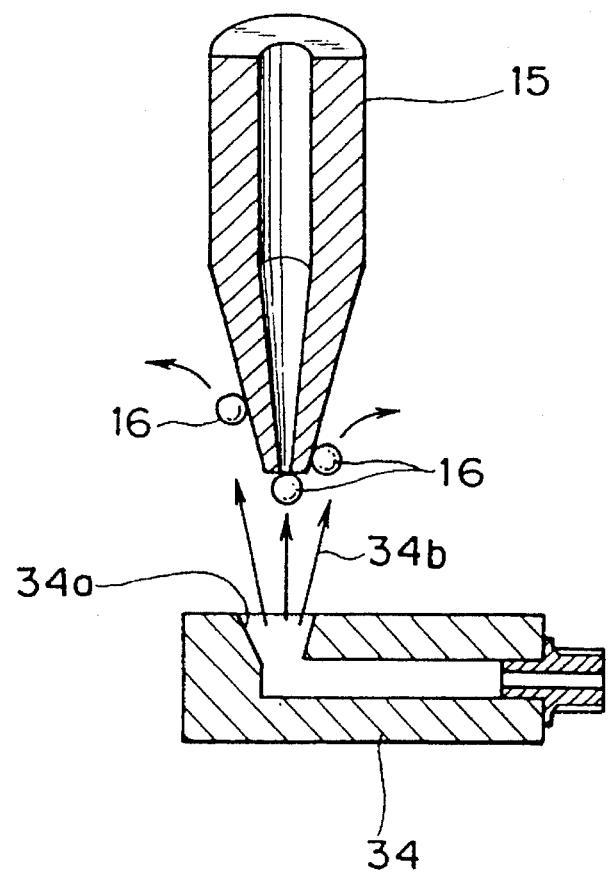
FIG. 6 is a sectional view of an air outlet.
Figure 7:
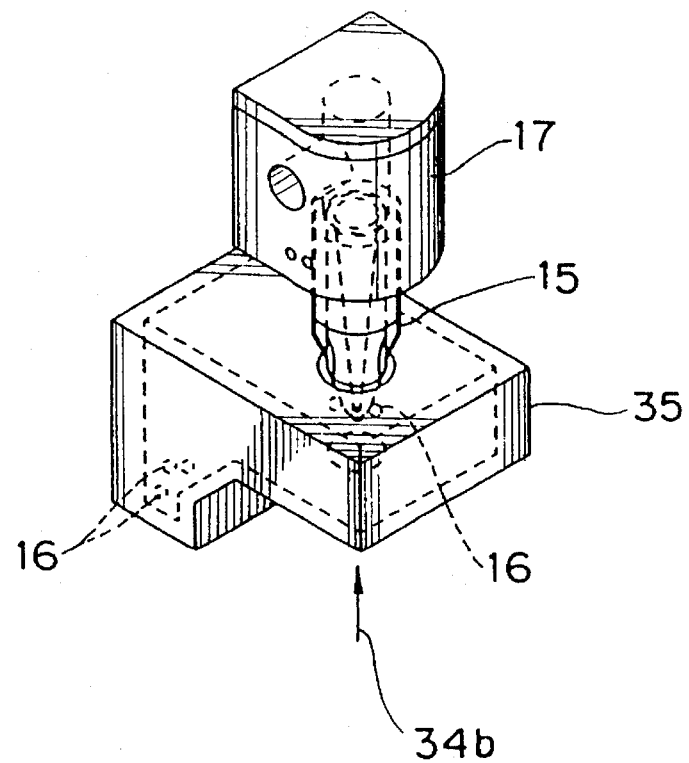
FIG. 7 is a schematic perspective view of a ball collection box.

In FIG. 2, reference 34 denotes air discharge means. This air discharge means 34 is mounted on the vertical arm 32. FIG. 6 shows the air discharge means 34 in detail. In the air discharge means 34, air is discharged from an outlet port 34a formed in an upper side of the air discharge means 34. With the distal end portion of the suction head 15 held in alignment with the outlet port 34a, air is discharged from the outlet port 34a so that only those solder balls 16, which are wastefully attached to other area of the suction head 15 than the holding surface 15a under the effect of static electricity, etc., are removed by means of blowing-off. In order to prevent the removed solder balls 16 from scattering, as shown in FIG. 7, there is employed a solder ball collection box 35 having openings each formed in upper and lower surfaces thereof. Owing to the foregoing arrangement, by inserting the distal end of the suction head 15 into the upper opening and blowing air into the lower opening by means of the air discharge means 34, the removed wasteful solder balls 16 can be collected in the solder ball collection box 35.

In FIG. 2, reference 36 denotes flux feed means. The flux feed means 36 includes a syringe 36a to be filled with flux. The syringe 36a has a feed port which is formed in a lower portion of the syringe 36a. Reference numeral 37 denotes a syringe moving cylinder adapted to move the syringe 36a in a lateral direction. In accordance with the actuation of the syringe moving cylinder 37 and the movement of the X-Y table 11, the feed port of the syringe 36a and the prescribed pad 13 on the printed-wiring board 12 are positionally aligned, and a predetermined amount of flux is fed to the top of the pad 13.

Reference numeral 38 denotes a laser unit or laser assembly. The laser unit 38 includes a motor 39 for moving the laser unit 38 upwardly and downwardly. The laser unit 38 further includes a slide member 40 which is vertically positionably moved by the motor 39. Three laser irradiating means, that is, a guide beam laser irradiating means 41 and two ball fusing laser irradiating means 42 and 42 located on opposite sides of the guide beam laser irradiating means 41, are fixedly mounted on the slide member 40 such that the three laser irradiating means 41, 42 and 42 are intersected at one point.

Reference numeral 43 denotes a camera assembly. This camera assembly 43 includes a motor 44 for moving the camera assembly 43 upwardly and downwardly. The camera assembly 43 further includes a slide member 45 which is vertically positionably slid by the motor 44. A television camera 46 is fixedly mounted on the slide member 45. When the printed-wiring board 12 is mounted on the X-Y table 11, a vertical mounting error tends to occur. To prevent this, the television camera 46 is moved upwardly and downwardly by the motor 44, so that the camera 46 is well focused on the pad 13 on the printed-wiring board 12. A picture taken by this television camera 46 is displayed on the external monitor television 3.

Figure 8:
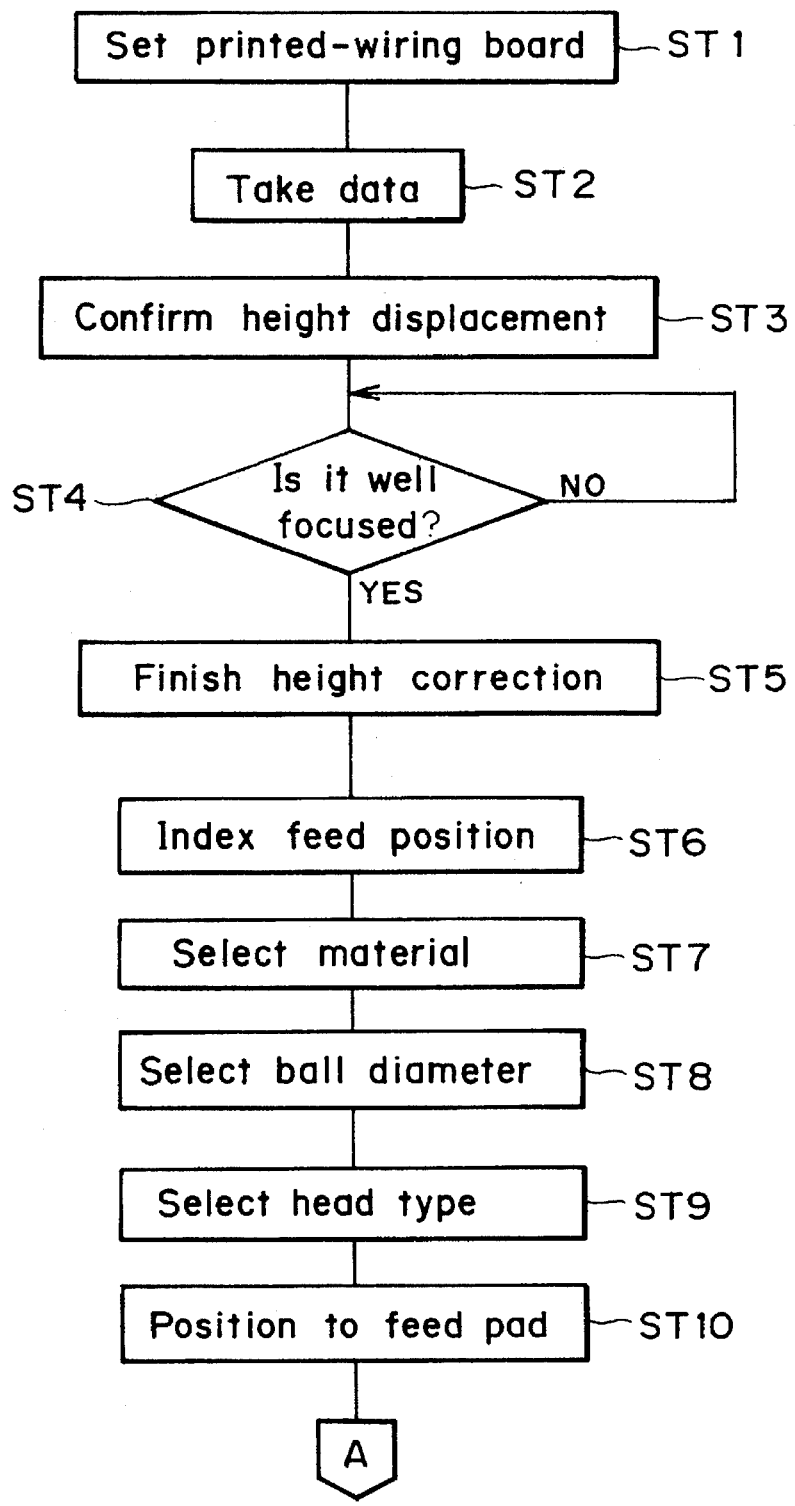
FIGS. 8 to 10 are flow charts showing the procedure of one embodiment of the present invention.
Figure 9:
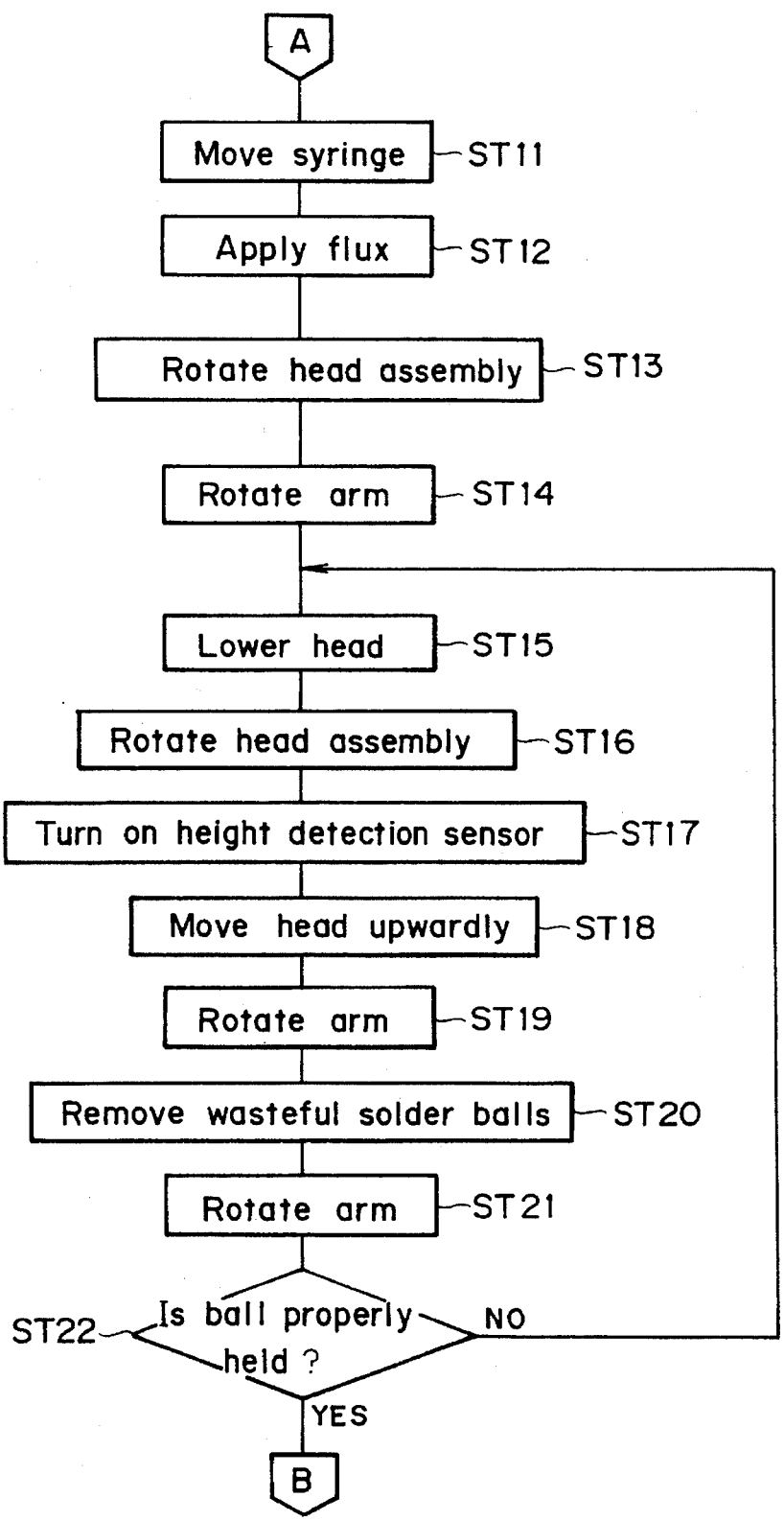

A solder-film forming process employing the above-described embodiment will now be described with reference to the flow charts shown in FIGS. 8 to 10. In FIG. 8, first, a worker secures the printed-wiring board 12, on which a solder-film is to be formed, to a predetermined position on the X-Y table 11 of the solder-film forming apparatus (Step 1). The printed-wiring board 12 is secured to the X-Y table 11 by positioning pins arranged on the X-Y table 11. Then, when the personal computer 1 is instructed to start operation by designating corresponding printed-wiring board information, etc., the specific printed-wiring board information is taken into the personal computer 1 (Step 2). This printed-wiring board information includes data relating to the position and the kind of each pad 13, as well as data relating to the kind of each pad, material thereof, ball diameter, and the type of each head, all as shown in FIG. 11, or the like. These data are pre-stored in a storage device (floppy disk or the like) of the personal computer 1, or the data are transmitted from other computers, etc. which are connected to the personal computer 1 through a LAN, or the like.

Then the positional displacement of the printed-wiring board 12 in a Z (height) direction is checked or confirmed by the television camera 46 of the camera assembly 43 (Step 3). If the displacement is confirmed, the motor 44 of the camera assembly 43 is actuated by the motor controller of the control means to cause the television camera 46 to move upwardly and downwardly. As a result, the television camera 46 is well focused (Step 4). An amount of movement of the television camera 46 required for this focusing is stored as a correction value for laser irradiation which is effected later. If the storage of the correction value of the printed-wiring board height is finished (Step 5), the pad 13 on the printed-wiring board 12, to which the solder ball is to be fed, is indexed by the personal computer 1 based on the printed-wiring board information (Step 6) and a solder material to be fed to the pad 13, the diameter of the solder ball and the type of the head to be used are selected (Steps 7 to 9). Then, the X-Y table 11 is actuated by the XY table controller and the specific pad 13 on the printed-wiring board 12 is moved to the solder ball feed position (step 10).

Subsequently, in FIG. 9, the syringe moving cylinder 37 is actuated to positionally align the feed port of the syringe 36a to the pad 13 of the printed-wiring board 12 (Step 11). Here, a predetermined amount of flux is fed from the feed port of the syringe 36a by a dispenser and applied to the top of the pad (Step 12). After the completion of the feed of flux, the head assembly rotating motor 25 is actuated by the head assembly rotating motor controller and the head assembly 14 corresponding to the type of the head assembly selected in Step 9 is moved to the ball suction position on the solder ball receiving portion 31 in which the solder balls 16 selected in Steps 7 and 8 are received (Step 13).

At this time, the arm rotating motor 29 is also actuated, the cylinder 27 is also moved to the ball suction position (Step 14), and the working shaft of the cylinder 27 is lowered (Step 15). As a result, the suction head 15 is inserted into the solder ball receiving portion 31 (Step 16). At the same time, the suction means is actuated and the suction force is acted on the opening of the suction head 15. When the suction head 15 is brought into abutment with the solder balls 16 and received pressure therefrom, the head support member 17 is approached to the slide member 22 against the biasing force of the spring 21 and this is detected by the height sensors 23 (Step 17). Based on this detection, the head assembly 14 is moved upwardly (Step 18).

Then, the arm rotating motor 29 is actuated, the air discharge means 34 is brought into opposing relation to the suction head 15 (Step 19), and air is discharged toward the distal end of the suction head 15 from the air discharge means 34. As a result, wasteful solder balls 16, which are attached to other area than the holding surface 15a of the suction head 15 under the effect of electrostatic force, etc., are removed, if any (Step 20). After the completion of removal of the wasteful solder balls 16, the arm rotating motor 29 is actuated (Step 21), the infrared sensor is positioned to form a predetermined positional relation with the head assembly 14 (suction head 15), and it is judged whether or not the solder ball 16 is properly held on the holding surface 15a of the suction head 15 under the suction force (Step 22). If the judgment result is negative, the program returns to Step 15 and the sequence of procedure for holding the solder ball under the effect of suction force is executed again. In contrast, if the judgment result is affirmative, the program proceeds to Step 23.

Figure 10:
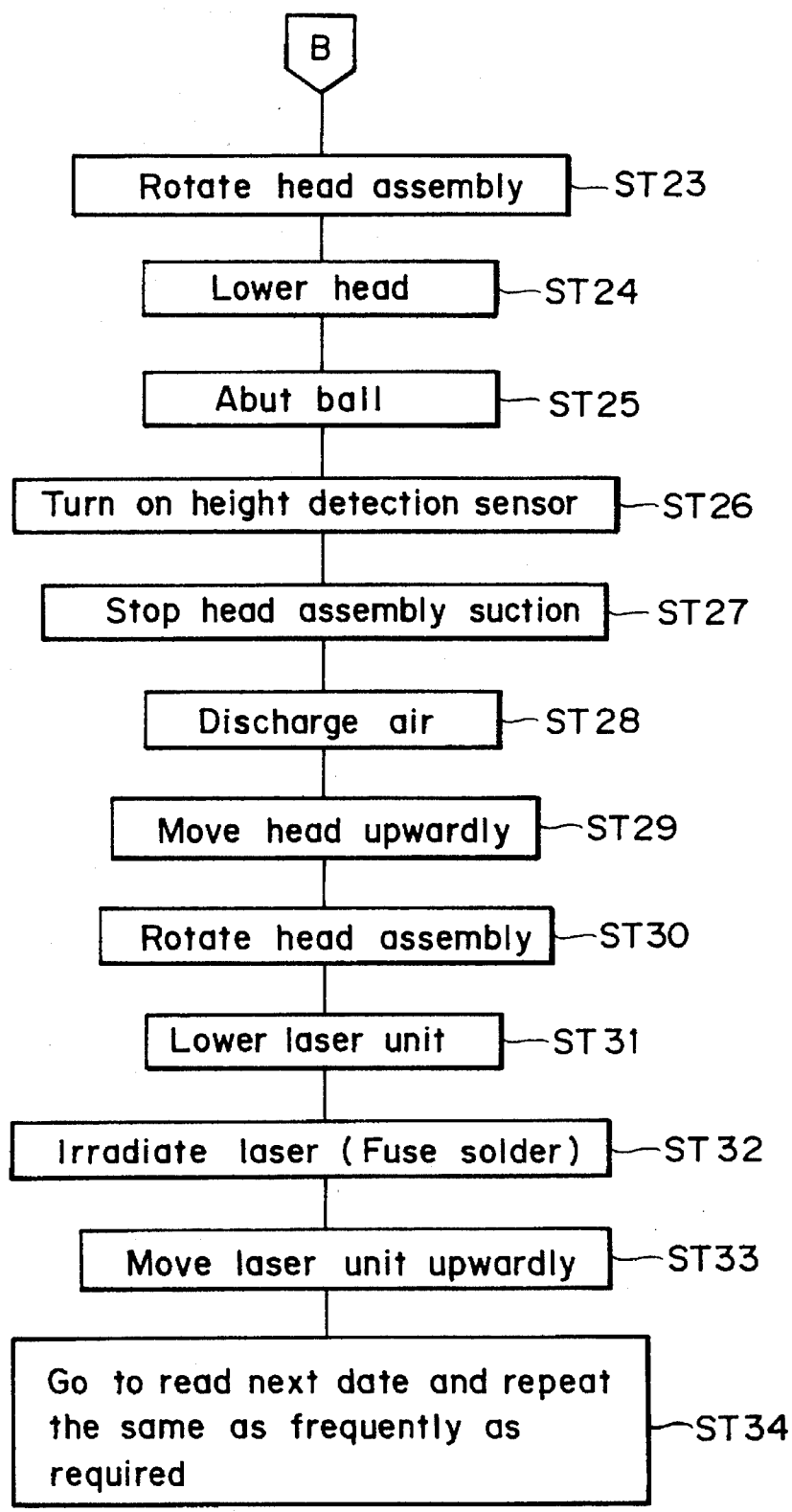

In FIG. 10, the head rotating motor 25 is actuated, the head assembly 14 with the solder ball 16 attached thereto under the effect of the suction force is moved onto the pad 13 of the printed-wiring board 12 set in the solder feed position (Step 23), the cylinder 26 is actuated, the head assembly 14 is lowered (Step 24) and the solder ball 16 is brought into abutment with the pad 13 (Step 25). When the distal end (solder ball 16) of the suction head 15 is brought into abutment with the pad 13, the head support member 17 is approached to the slide member 22 by the pushing pressure thereof against the biasing force of the spring 21 and this is detected by the height sensors 23 (Step 26). Based on this detection, the lowering movement of the head assembly 14 is stopped.

Subsequently, the suction force from the suction means for holding the solder ball 16 is canceled (Step 27), air is discharged from the opening of the suction head 15 (Step 28) and the head assembly 14 is moved upwardly (Step 29). By this, the solder ball 16 is temporarily secured to the top of the pad 13. Since the flux is preliminarily applied to the top of the pad 13, the positional displacement does not occur. The reason why the air is discharged is that by doing this, the solder ball 16 is prevented from being held on the suction head 15 under the effect of the electrostatic force and the like. The head assembly 14, which has completed the feed of the solder ball 16, is rotated and standby for the next operation in the home position (Step 30).

Next, the procedure for fusing the solder ball 16 is started. When the solder ball 16 is temporarily secured to the top of the pad 13 by the flux, the motor 39 of the laser unit 38 is actuated and the laser irradiating means 41 and 42 are lowered to predetermined positions, respectively (Step 31). The lowering amount of this time is equivalent to an amount obtained by correcting the reference amount with the correction value detected in Steps 3 to 5. Then, the laser irradiating means 41 and 42 are actuated, the laser beam is irradiated to the solder ball 16 on the pad 13 and the solder ball 16 is fused (Step 32). At that time, output of the laser beam and irradiating time period are preliminarily determined depending on the kind of pads which are established in the printed-wiring board information and realized by the laser controller. After the solder ball 16 is fused, the motor 39 of the laser unit 38 is actuated and the laser unit 38 is moved upwardly to a predetermined position. Then, the data of the printed-wiring board information which is to be processed next are read in order to execute the procedure for the next pad, and the above sequence of procedure is repeated one after another (Step 34).

According to this embodiment, since the solder ball 16 is automatically fed to the top of the pad 13 of the printed-wiring board 12 in accordance with the printed-wiring board information, the working efficiency can be remarkably enhanced compared with the conventional method in which the solder ball is manually fed, and the solder ball 16 suitable to the kind of the pad 13 can be properly fed to the top of the pad 13. Besides since the present embodiment includes the air discharge means 34, wasteful solder balls 16 attached to other area than the holding surface 15a of the suction head 15 under the effect of electrostatic force, etc. can be removed, if any. Accordingly, there is no fear that wasteful solder balls (i.e., solder balls which are not needed) are supplied onto the printed-wiring board.

Then, it is judged, by the infrared sensor 33, whether or not the solder ball 16 is properly attached to the suction head 15 under the suction force. If the judgment is negative, the procedure for drawing the solder ball 16 is executed again. Accordingly, a possible inadvertent failure of the supply of the solder ball can be avoided. Furthermore, since the suction means and the suction head 15 are connected by way of the spiral tube in order to draw the solder ball 16, undue force is less frequently applied to the suction head 15. As a result, a constant pressure applied to the pad 13 by the distal end of the suction head 15 can be maintained and therefore, the printed-wiring board 12 is hardly subjected to damage.

Since the flux is preliminarily applied to the pad 13 on the printed-wiring board 12 by the flux feed means 36 before the solder ball 16 is fed to the pad 13, the solder ball 16 is temporarily secured to the top of the pad 13 by the flux and therefore, a possible displacement of the solder ball 16 caused by the effect of vibrations, etc. can be prevented. On the other hand, the solder ball is fused spot-wise and in a non-contact state by laser beam. Accordingly, a thermal stress can be avoided which is otherwise applied to the entire printed-wiring board 12 even if a small number of solder-films are to be formed, and therefore, the solder-films can be selectively and efficiently formed.

And even in the case where positional irregularity occurs during the work for securing the printed-wiring board 12 to the X-Y table 11, this positional irregularity is detected by the camera assembly 43 so that the positional relation between the printed-wiring board 12 and the laser irradiating means 41 and 42 can be corrected normally in the best condition and the solder ball 16 can be fused reliably.

Since the present invention is constructed in the manner as described above, there can be provided an apparatus for forming a solder-film in which the solder-film is automatically formed on the top of the pad of the printed-wiring board.

What is claimed is:

1. An apparatus for forming a solder-film on a printed-wiring board, comprising:

a vertical shaft;

a plurality of suction heads rotatably and slidably mounted on said shaft, each of said suction heads having at a distal end thereof a holding surface for holding a solder ball and a suction port opening to said holding surface;

a plurality of receiving means each for receiving solder balls having different diameters, said receiving means being arranged so as to be accessible to said suction heads;

suction means for generating a negative pressure in said suction port of each of said suction heads;

first drive means for rotatably moving said suction heads around said shaft;

second drive means for slidably moving said suction heads along said shaft;

means for blowing air to the distal end of each of said suction heads when said air blowing means is brought into opposing relation with each of said suction heads; and control means having printed-wiring board information in which data including positional information of pads on said printed-wiring board and types of solder balls to be applied to the respective pads are preset, for controlling movements of each of said suction heads by said first and second drive means, said control means further controlling an operation of said suction means in accordance with said printed-wiring board information.

2. An apparatus for forming a solder-film on a printed-wiring board as claimed in claim 1, further comprising means for detecting whether or not said solder ball is held on said holding surface of said suction head.

3. An apparatus for forming a solder-film on a printed-wiring board as claimed in claim 2, wherein said detection means comprises an infrared ray emitting portion and an infrared ray receiving portion located opposite to said infrared ray emitting portion.

4. An apparatus for forming a solder-film on a printed-wiring board as claimed in claim 1, wherein said suction means and said suction head are communicated with each other through a spiral tube.

5. An apparatus for forming a solder-film on a printed-wiring board as claimed in claim 1, further comprising means for feeding a flux to a pad of said printed-wiring board on which the solder-film is to be formed, before a solder ball is fed thereto.

6. An apparatus for forming a solder-film on a printed-wiring board as claimed in claim 1, further comprising:

means for irradiating a laser beam to a solder ball placed on a pad of said printed-wiring board so that said solder ball is fused in a non-contacted state; and laser moving means, controlled by said control means, for moving said laser irradiating means.

7. An apparatus for forming a solder-film on a printed-wiring board as claimed in claim 6, further comprising:

a television camera located opposite to said printed-wiring board; and television camera moving means for moving said television camera so that said television camera is well focused to that pad of said printed-wiring board on which a solder ball to be fused is placed, and informing the moved amount to said control means, said control means correcting an amount of movement of said laser moving means in accordance with said moved amount of said television camera.

* * * * *